US009711291B2

United States Patent
Knipe et al.

(10) Patent No.: US 9,711,291 B2
(45) Date of Patent: Jul. 18, 2017

(54) MEMS DIGITAL VARIABLE CAPACITOR DESIGN WITH HIGH LINEARITY

(71) Applicant: CAVENDISH KINETICS, INC., San Jose, CA (US)

(72) Inventors: Richard L. Knipe, McKinney, TX (US); Robertus Petrus Van Kampen, S-Hertogenbosch (NL)

(73) Assignee: Cavendish Kinetics, Inc., San Jose, CA (US)

(*) Notice: Subject to any disclaimer, the term of this patent is extended or adjusted under 35 U.S.C. 154(b) by 65 days.

(21) Appl. No.: 14/779,542

(22) PCT Filed: Apr. 2, 2014

(86) PCT No.: PCT/US2014/032723
§ 371 (c)(1),
(2) Date: Sep. 23, 2015

(87) PCT Pub. No.: WO2014/165624
PCT Pub. Date: Oct. 9, 2014

(65) Prior Publication Data
US 2016/0055980 A1    Feb. 25, 2016

Related U.S. Application Data

(60) Provisional application No. 61/808,377, filed on Apr. 4, 2013.

(51) Int. Cl.
*H01G 5/18* (2006.01)
*B81B 3/00* (2006.01)
(Continued)

(52) U.S. Cl.
CPC .............. *H01G 5/18* (2013.01); *B81B 3/007* (2013.01); *B81B 3/0051* (2013.01); *H01G 5/011* (2013.01);
(Continued)

(58) Field of Classification Search
CPC ........ H01G 5/18; H01G 5/011; H01G 5/0136; H01G 5/16; B81B 3/0051; B81B 3/007;
(Continued)

(56) References Cited

U.S. PATENT DOCUMENTS 6,229,684 B1 * 5/2001 Cowen ...................... F03G 7/06
361/277
6,307,452 B1 10/2001 Sun
(Continued)

FOREIGN PATENT DOCUMENTS

JP 2011011325 A 1/2011

OTHER PUBLICATIONS

International Search Report and Written Opinion dated Jul. 28, 2014 in correspondending International Application No. PCT/US2014/032723.

*Primary Examiner* — Eric Thomas
*Assistant Examiner* — Michael P McFadden
(74) *Attorney, Agent, or Firm* — Patterson & Sheridan, LLP

(57) ABSTRACT

The present invention generally relates to a MEMS DVC and a method for fabrication thereof. The MEMS DVC comprises a plate movable from a position spaced a first distance from an RF electrode and a second position spaced a second distance from the RF electrode that is less than the first distance. When in the second position, the plate is spaced from the RF electrode by a dielectric layer that has an RF plateau over the RF electrode. One or more secondary landing contacts and one or more plate bend contacts may be present as well to ensure that the plate obtains a good contact with the RF plateau and a consistent $C_{max}$ value can be obtained. On the figure PB contact is the plate bend contact, SL contact is the Second Landing contact and the PD electrode is the Pull Down electrode.

22 Claims, 30 Drawing Sheets

(51) Int. Cl.
  *H01G 5/16*     (2006.01)
  *H01H 59/00*    (2006.01)
  *H01G 5/011*    (2006.01)
  *H01G 5/013*    (2006.01)

(52) U.S. Cl.
  CPC ............ *H01G 5/0136* (2013.01); *H01G 5/16* (2013.01); *H01H 59/0009* (2013.01); *B81B 2201/0221* (2013.01); *H01H 2059/0072* (2013.01)

(58) Field of Classification Search
  CPC ........ B81B 2201/0221; H01H 59/0009; H01H 2059/0072
  USPC ........................................................ 361/278
  See application file for complete search history.

(56) References Cited

U.S. PATENT DOCUMENTS

| | | |
|---|---|---|
| 2004/0124497 A1 | 7/2004 | Rottenberg et al. |
| 2006/0226501 A1 | 10/2006 | Allen Chou |
| 2009/0190284 A1 | 7/2009 | Konishi et al. |
| 2012/0068278 A1* | 3/2012 | Knipe ................... H01H 1/0036 257/418 |
| 2012/0255841 A1* | 10/2012 | Shin ................... H01H 59/0009 200/181 |

\* cited by examiner

MEMS DIGITAL VARIABLE CAPACITOR DESIGN WITH HIGH LINEARITY

BACKGROUND OF THE INVENTION

Field of the Invention

Embodiments of the present invention generally relate to a micro electromechanical system (MEMS) digital variable capacitor (DVC) and a method for fabrication thereof.

Description of the Related Art

A MEMS DVC may have a plate or cantilever electrode disposed over an RF electrode. The plate or cantilever electrode is movable from a first position spaced from the RF electrode to a second position spaced from the RF electrode. The second position is closer to the RF electrode than the first position and thus has a higher capacitance. The farther away from the RF electrode that the plate or cantilever electrode is located, the lower the capacitance of the MEMS DVC.

In order to move the plate or cantilever electrode, another electrode applies a voltage to either pull-in the plate or cantilever electrode towards the RF electrode. The plate or cantilever electrode may, unfortunately, land on a dielectric layer that is above not only the RF electrode, but also above a pull-in electrode. If the plate or cantilever electrode lands above the pull-in electrode, a charge may build up in the dielectric layer and thus decrease not only the efficiency of the MEMS DVC, but also the reliability of the MEMS DVC.

Therefore, there is a need in the art for a MEMS DVC, and method of fabrication thereof, that reduces and/or eliminates charge build-up in the dielectric layer disposed over a pull-in electrode.

SUMMARY OF THE INVENTION

The present invention generally relates to a MEMS DVC and a method for fabrication thereof. The MEMS DVC comprises a plate movable from a position spaced a first distance from an RF electrode and a second position spaced a second distance from the RF electrode that is less than the first distance. When in the second position, the plate is spaced from the RF electrode by a dielectric layer that has an RF plateau over the RF electrode. One or more secondary landing contacts and one or more plate bend contacts may be present as well to ensure that the plate obtains a good contact with the RF plateau and a consistent $C_{max}$ value can be obtained.

In one embodiment, a MEMS DVC comprises a substrate having at least one first electrode, at least one second electrode and an RF electrode disposed therein; a dielectric layer disposed over the substrate, the at least one first electrode, the at least one second electrode and the RF electrode, wherein the dielectric layer comprises an RF plateau over the RF electrode and at least one secondary landing contact above and at least partially surrounded by the at least one second electrode; and a plate coupled to the at least one first electrode and extending over the at least one second electrode and the RF electrode, the plate movable from a first position spaced from the dielectric layer and a position in contact with the RF plateau.

In another embodiment, a method for manufacturing a MEMS DVC comprises forming a plurality of electrodes into a substrate; etching the substrate such that the plurality of electrodes extend above the substrate; depositing a first dielectric layer over the substrate and the plurality of electrodes; depositing and patterning an electrically conductive material over the first dielectric layer; patterning and partially etching the first dielectric layer to create an RF plateau over an RF electrode and a secondary landing contact above, and surrounded by, a first electrode of the plurality of electrodes; depositing a second dielectric layer over the patterned electrically conductive material, the RF plateau and the secondary landing contact; and forming a plate over the second dielectric layer, the plate electrically connected to a second electrode of the plurality of electrodes, wherein the plate is movable from a position spaced from the RF plateau and a position in contact with the RF plateau, wherein the RF plateau extends a greater distance above the substrate as compared to the secondary landing contact.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a MEMS DVC and a method for fabrication thereof. The MEMS DVC comprises a plate movable from a position spaced a first distance from an RF electrode and a second position spaced a second distance from the RF electrode that is less than the first distance. When in the second position, the plate is spaced from the RF electrode by a dielectric layer that has an RF plateau over the RF electrode. One or more secondary landing contacts and one or more plate bend contacts may be present as well to ensure that the plate obtains a good contact with the RF plateau and a consistent $C_{max}$ value can be obtained.

Figure 1:
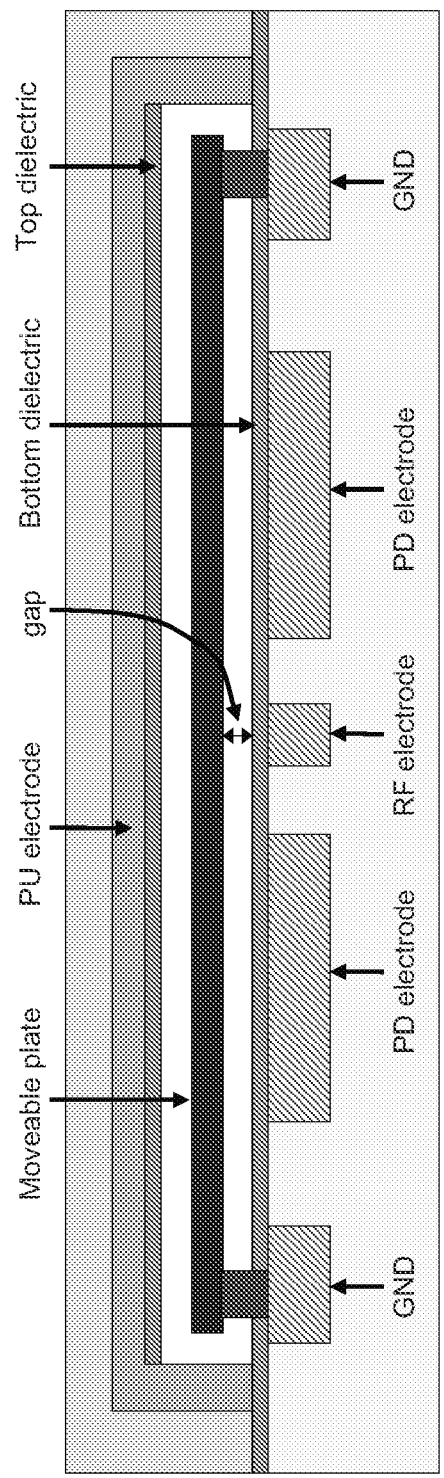
FIG. 1 is a schematic cross-sectional illustration of a MEMS DVC in the free-standing state.
Figure 2:
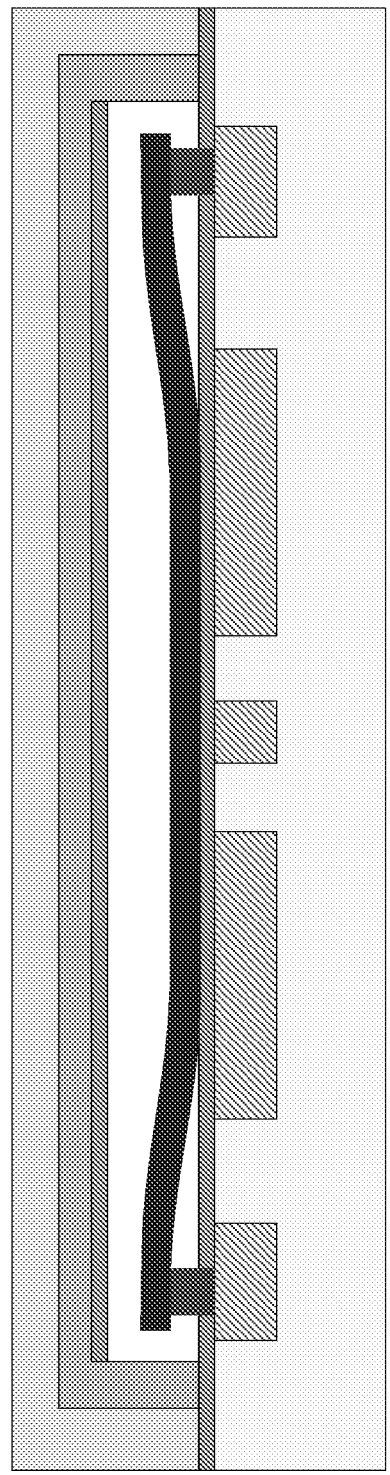
FIG. 2 is a schematic cross-sectional illustration of the MEMS DVC of FIG. 1 in the $C_{max}$ state.
Figure 3:
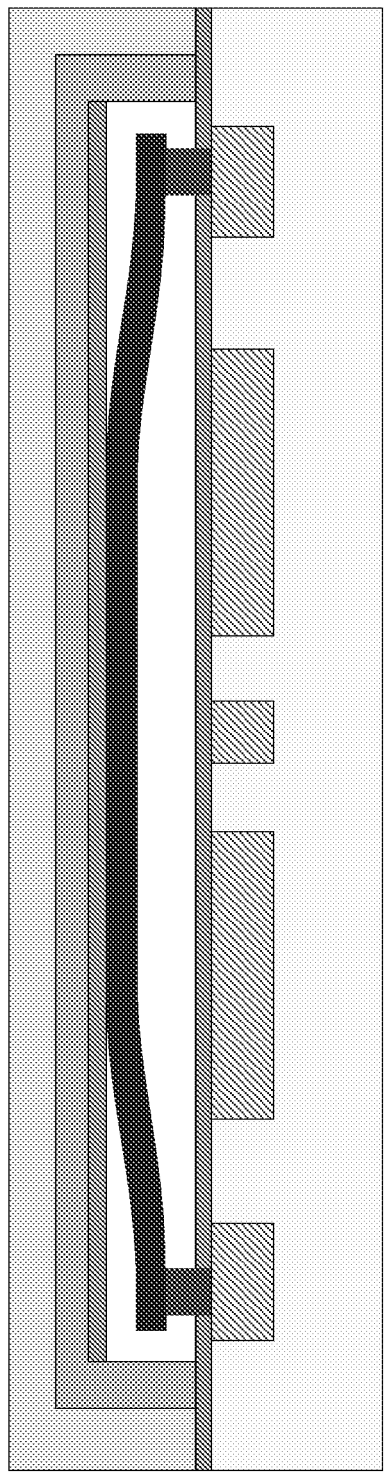
FIG. 3 is a schematic cross-sectional illustration of a MEMS DVC of FIG. 1 in the $C_{min}$ state.

A MEMS DVC device is based on a moveable MEMS plate with a control-electrode above (i.e., a pull-off electrode or a pull-up electrode or a PU-electrode) and below (i.e., a pull-in electrode or a pull-down electrode or a PD-electrode) the moveable MEMS plate, as shown schematically in FIG. 1. These electrodes are covered with a top and bottom dielectric layer. In addition there is an RF-electrode below the moveable MEMS element. Between the moveable plate and the RF-electrode there is a gap that is modulated by the voltages applied to either the PU-electrode or the PD-electrode. These voltages result in electrostatic forces, which pull the MEMS element either up or down in contact to provide a stable minimum or maximum capacitance to the RF-electrode. In this way, the capacitance from the moveable plate to the RF-electrode can be varied from a high capacitance state, $C_{max}$, when pulled to the bottom (FIG. 2) to a low capacitance state, $C_{min}$, when pulled to the top (FIG. 3).

For RF applications, the tunable range of the capacitance is an important parameter since it defines how much the resonant frequency of an antenna can be tuned for optimum performance over different frequency bands. To obtain a large tuning range, a relative large gap between the moveable element and the RF-electrode is needed.

The first issue to consider is the operating voltage of the MEMS DVC device and the hot-switch performance. The electrostatic forces used to move the plate up or down scale with $1/gap^2$, resulting in large required voltages. In order to limit the operating voltage of the MEMS DVC devices to acceptable levels which allow for a co-integration of the MEMS devices on a CMOS chip (e.g., <30V), a compliant spring mechanism can be used to suspend the moveable plate over the RF-electrode, so that the MEMS device can be programmed at a lower voltage, while still allowing for an acceptable tuning range of the capacitance. A downside of the compliant spring is that the device can be held in the $C_{max}$ state when an RF voltage is applied to the device, resulting in a failure to program the device in the $C_{min}$ state in the presence of an RF-signal.

A second issue that affects many MEMS DVC devices is related to the charging of the dielectric layers. When the membrane lands on the dielectric layer above the bottom or top electrode, the electric field in the dielectric layer can become so large that charges are injected into this dielectric layer which causes a shift in the actuation voltages of the device. This shift can make the device inoperable after a limited number of operating cycles, severely limiting the lifetime of the device.

A third issue to consider for MEMS DVC devices is the linearity of the capacitance versus the applied RF power. In order for the MEMS DVC device to be usable in an RF application, the RF signal cannot be distorted by non-linear elements. For the MEMS DVC device this typically means that the capacitance of the device cannot be modulated by the RF signal.

As discussed herein, the embodiments disclosed herein address all of the above issues and allows for a highly-linear DVC device which can be co-integrated with the CMOS controller on the same chip and does not suffer from charging resulting in a high lifetime.

Figure 4:
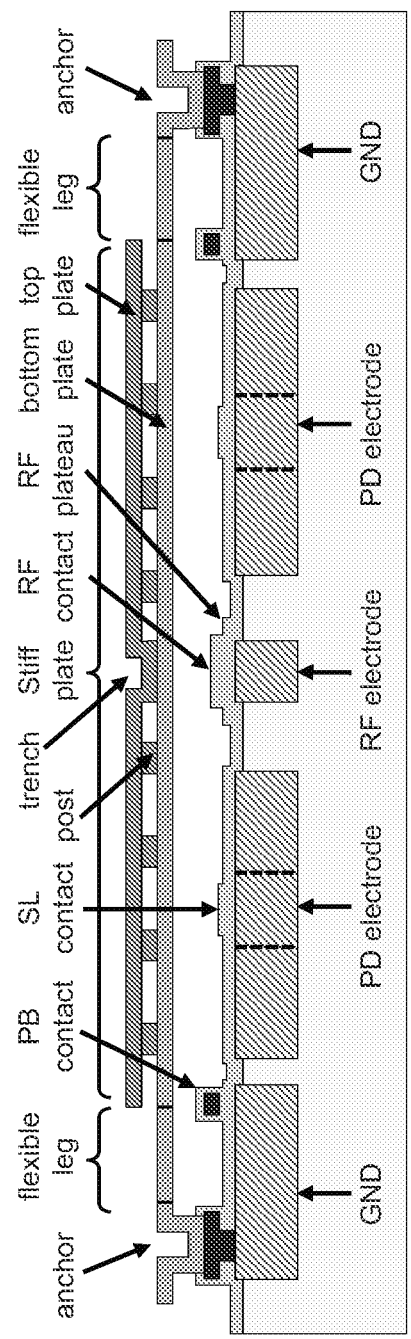
FIG. 4 is a schematic cross-sectional illustration of a MEMS DVC device according to one embodiment.

FIG. 4 shows a MEMS DVC device according to one embodiment that resolves the above mentioned issues. Only the bottom layers of the MEMS DVC device have been shown and the top-electrode has been omitted for clarity. The device consists of a stiff plate suspended above the surface by flexible legs. The plate has a high rigidity by the use of two stacked plates (top-plate and bottom-plate) connected to each other by a plurality of posts. The flexible legs are defined in only one of the plates, e.g. the bottom-plate layer. It is to be understood that while the flexible legs are shown in the bottom-plate layer, the flexible legs could instead be defined in the top-plate layer. The flexible legs allow the moveable plate to be actuated by a low-enough voltage for CMOS control to move the plate up or down.

Figure 5:
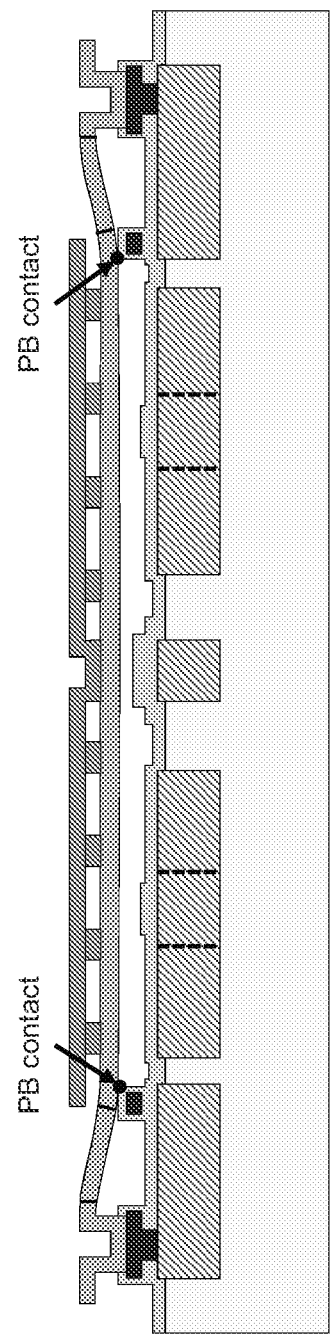
FIG. 5 is a schematic cross-sectional illustration of the MEMS DVC device of FIG. 4 when the plate has landed on the plate bend contacts.

Additionally, extra landing contact points have been added (Plate Bend contacts or PB contacts) which are typically 30 nm to 80 nm taller than the RF-contact points. The RF contact is coupled to and above the RF plateau. When the plate is pulled down it initially comes into contact with the PB-contact points (FIG. 5).

Figure 6:
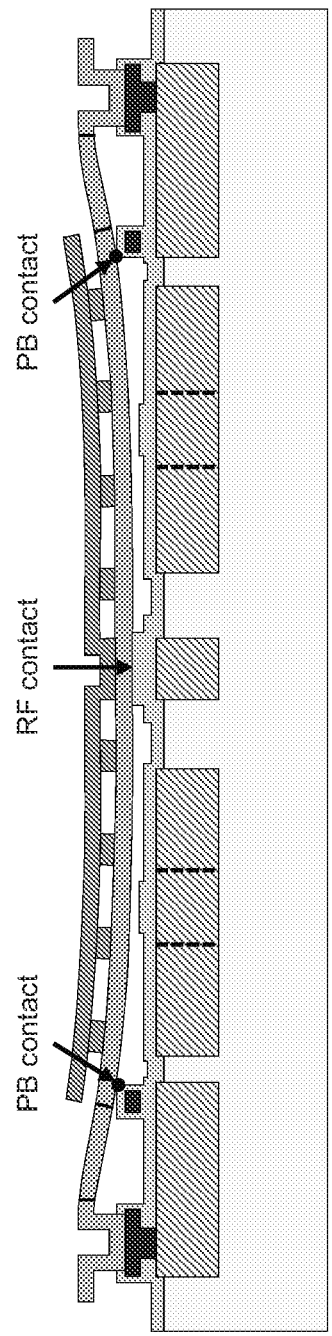
FIG. 6 is a schematic cross-sectional illustration of the MEMS DVC device of FIG. 4 when the plate has landed on both the plate bend contacts and the RF contact.

To land the device on the RF contact, the plate needs to be bent further. Because the plate is rigid this requires more electrostatic force. Once landed on the PB-contacts the gap to the PD-electrode has reduced which increases the electrostatic forces applied to the plate. This allows the plate to be pulled-into contact with the RF contact with little extra actuation voltage (FIG. 6).

Figure 7:
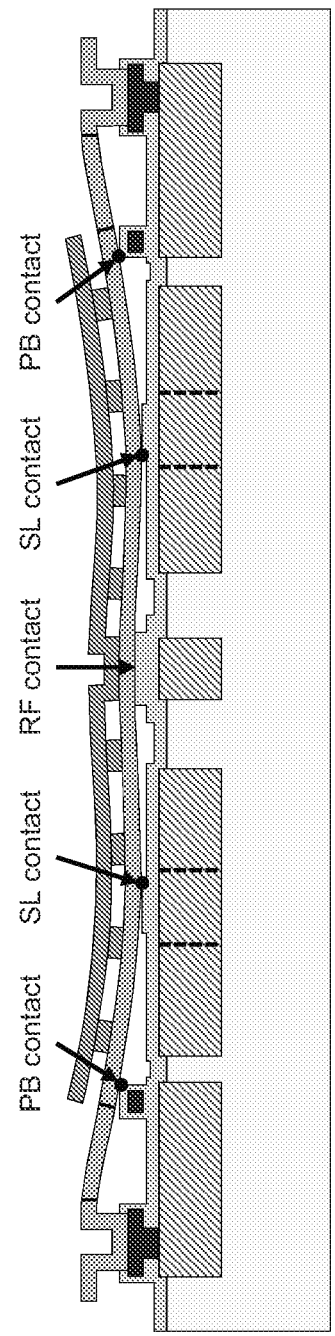
FIG. 7 is a schematic cross-sectional illustration of the MEMS DVC device of FIG. 4 when the plate has landed on the plate bend contacts, the RF contact and the secondary landing contacts.

Additional contact points (Secondary Landing contacts or SL contacts) have been defined in the PD regions with a height a little lower than the RF contact height (e.g. 10 to 50 nm lower). The final $C_{max}$ state is reached by increasing the actuation voltage on the PD-electrode further which pulls the plate down until it also comes in contact with these SL contacts (FIG. 7).

When programming the device in the $C_{min}$ state, the voltage on the PD-electrode is removed. The plate initially releases from the SL contacts and will still be engaged by the RF contact and the PB contacts as shown in FIG. 6. Because the rigid plate is still bent, it has a high restoring force and the plate is subsequently released from the RF contact by the mechanical restoring force of the plate, even in the presence of an RF signal on the RF electrode. Once it releases from the RF contact the electrostatic force acting on the plate by the RF electrode is substantially reduced and the legs are able to further pull the plate upwards.

Figure 8:
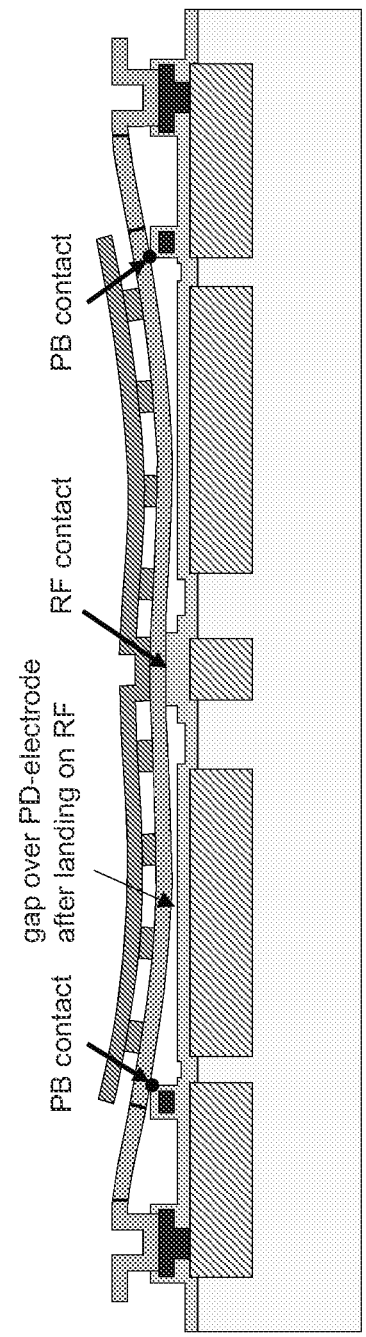
FIG. 8 is a schematic cross-sectional illustration of a MEMS DVC device in the $C_{max}$ state without secondary landing contacts.

The landing of the plate on the SL contacts is vital for the linearity of the DVC device. Without the SL contacts the plate position above the PD would not be defined very well (FIG. 8). Depending on the stiffness of the plate, the height of the PB contact and applied voltage, the shape of the device in the landed shape will vary. It is even possible for the device to secondary land on top of the dielectric layer above the PD electrode. When the device secondary lands, it can cause charging of the dielectric layer above the PD-electrode, which will impact the lifetime of the device.

Figure 9:
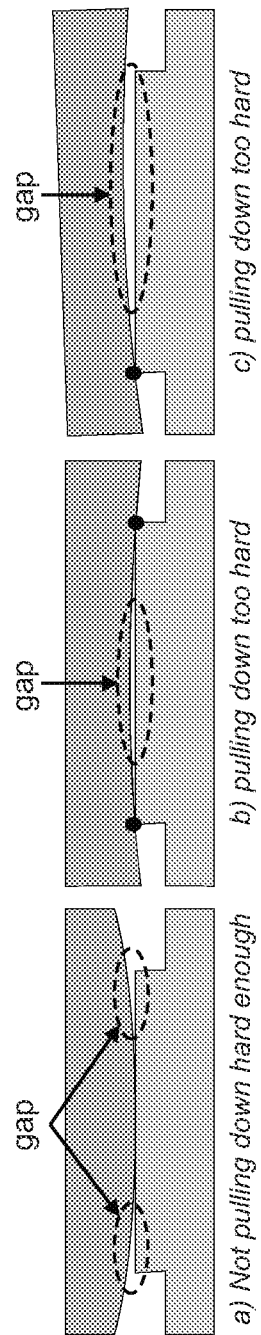
FIG. 9 is a close-up view of the RF plateau showing additional gaps.

In addition, the $C_{max}$ capacitance will decrease as a gap will occur between the plate and the RF-contact. If not using the SL-contacts, the plate may not properly engage the RF contact. FIG. 9 shows a close-up of the RF contact area when the device is in the $C_{max}$ state for a number of cases without SL-contacts present. If the plate is not pulled-down hard enough (FIG. 9a) an additional gap will exist on the outside of the RF contact area. If the device is pulled down harder (FIG. 9b) it can create a gap in the center of the RF contact area. If the device is pulled down even harder, the plate can secondary land, either on both PD-electrodes (FIG. 9b) or on only one PD-electrode pulling the device in a tilted mode (FIG. 9c).

The extra gap that would appear between the plate and the RF contact is the main source for a low linearity of the DVC device. If an RF signal is present on the RF electrode then an electrostatic force is acting on the landed plate. The higher the RF power, the more electrostatic force is generated, since this force scales with Voltage$^2$. The gap between the plate and the RF contact will subsequently decrease, resulting in an increase in the capacitance. Therefore, the capacitance will be modulated by the RF power and the device will exhibit a bad linearity.

By using the SL-contacts as shown in FIG. 7, the landed position of the device is fully determined and does not depend on the height of the PB contacts or stiffness of the plate. As long as a high enough voltage is applied on the PD-electrodes, the plate can be pulled in contact with the SL contacts. Once landed on the SL contacts a much higher stiffness of the plate between the three contact points (RF/SL/PB) is reached. This allows for applying an extra voltage on the PD electrode without resulting in much plate deflection. Furthermore, the position of the SL contacts can be chosen such that the force on the plate between the PB and the SL contacts is similar to the force on the plate between the SL and RF contact. These two forces balance each other and result in a stable plate position with an increased applied voltage on the PD-electrode.

Figure 10:
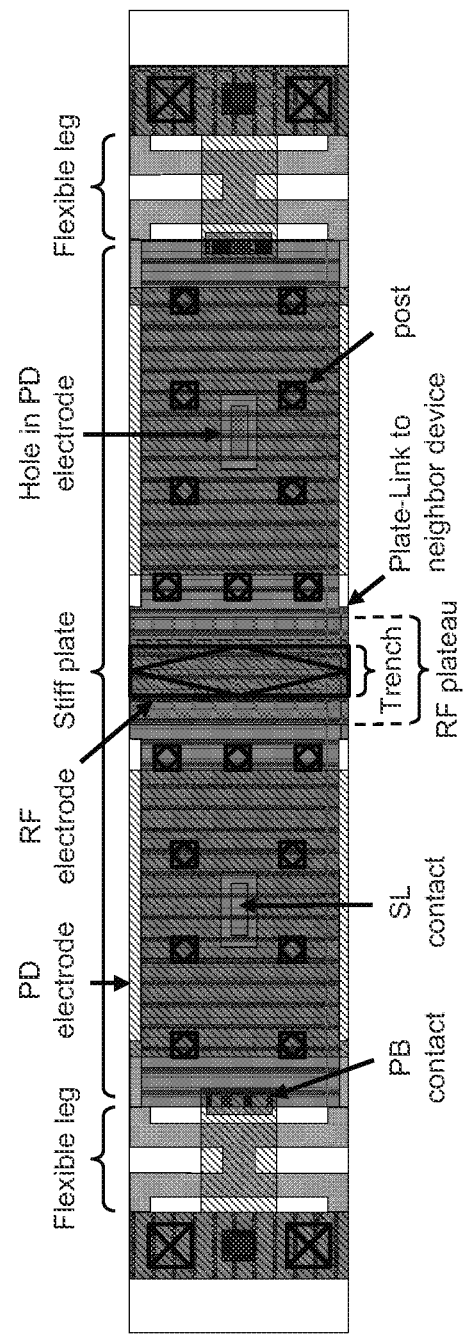
FIG. 10 is a top view of the MEMS DVC device of FIG. 4.

FIG. 10 shows a top-view of a single DVC device. FIG. 10 shows the flexible leg and the stiff plate with the posts connecting the bottom-plate to the top-plate. The PB contacts are located at the extreme ends of the stiff plate. The PD-electrode has holes defined in it which contain the SL contacts. In other words, the pull-down electrode surrounds a portion of the substrate and the secondary landing contacts are deposited onto the substrate directly. The SL contacts themselves protrude above the dielectric layer directly above the PD-electrode (see also FIG. 4). This ensures that in the landed $C_{max}$ state, the plate lands on the PD, RF and SL contacts and does not touch the dielectric layer directly above the PD-electrodes. This guarantees that the electric field in the bottom dielectric layer stays low enough to avoid charging of this dielectric layer. The RF plateau is defined at the same time in the process as the SL contacts and is used for planarization purposes during fabrication as will be discussed below.

Each MEMS DVC device has a limited $C_{max}$ of several fF. To increase the capacitance, multiple devices are placed next to each other. Neighboring devices are linked to each other with the top and bottom plate-layer in the RF-area. This ensures that the plate lands flat on the RF. Without these plate links, the Poisson's ratio of the bottom and top plate would cause the edges of the plate to curve up slightly when actuated in the down position. The resulting gap between the plate and the RF-contact in the landed position would create linearity issues. In addition, a trench runs along the RF electrode which locally places the top-plate directly on top of the bottom plate. This locally thickens the plate over the RF making it stiffer to further improve the linearity. The trench can be narrower than the RF-electrode, wider than the RF-electrode or as wide as the RF-electrode.

Figure 11:
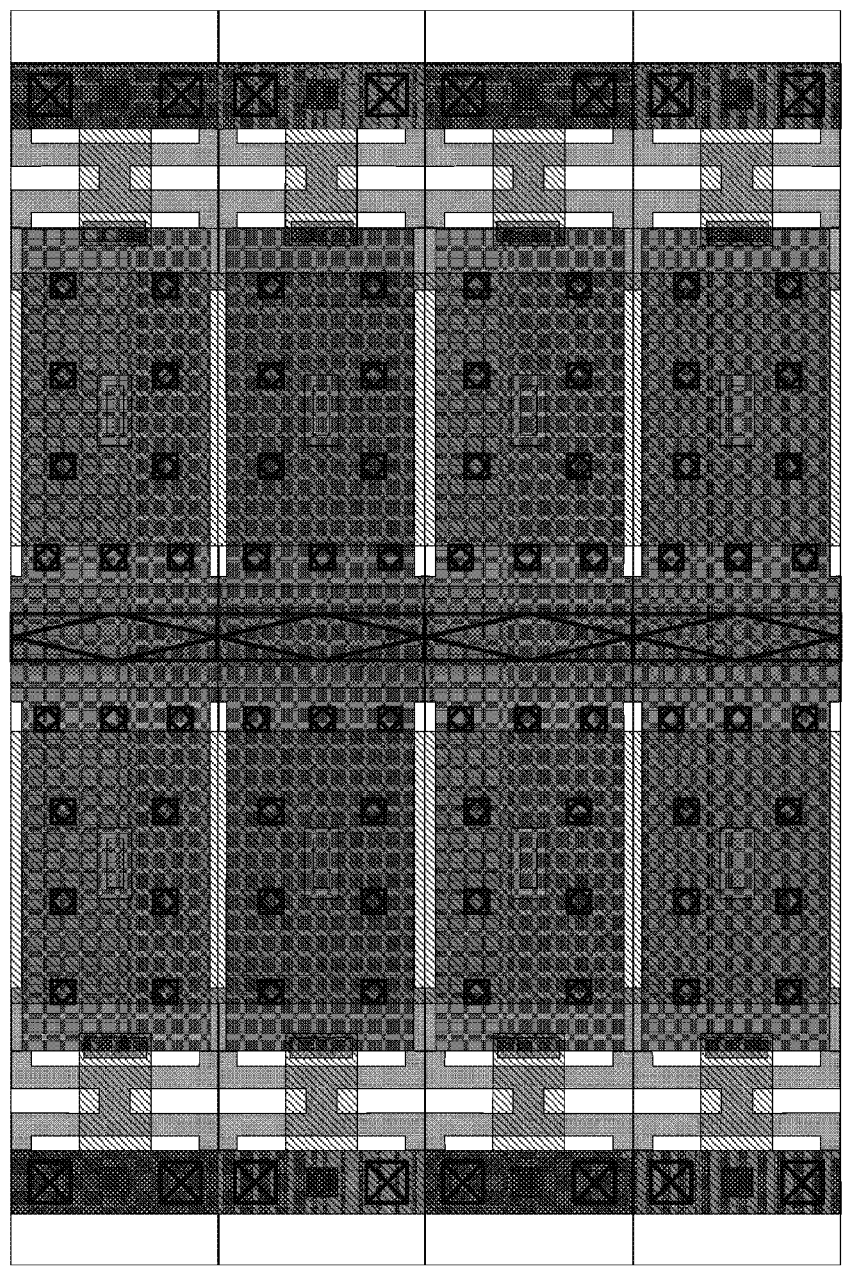
FIG. 11 is a top view of a part of a DVC cell having grouped MEMS DVC devices all actuated at the same time according to one embodiment.

FIG. 11 shows a top-view of several DVC devices which are linked to their neighboring devices. A single DVC-cell will contain many of these linked DVC-devices which are actuated at the same time by applying a voltage on the shared PD or PU-electrode. The number of DVC-devices grouped in a cell can be adjusted to generate the desired $C_{max}$ of the DVC-cell. The multiple DVC devices are placed next to each other and each device has links to neighboring devices. These links are implemented in both plate layers (bottom-plate & top-plate) and covers at least the complete RF-contact area. Additional plate-links between neighboring devices can be placed to allow larger control voltage to be applied without risking a secondary landing on the dielectric layer.

Figure 12:
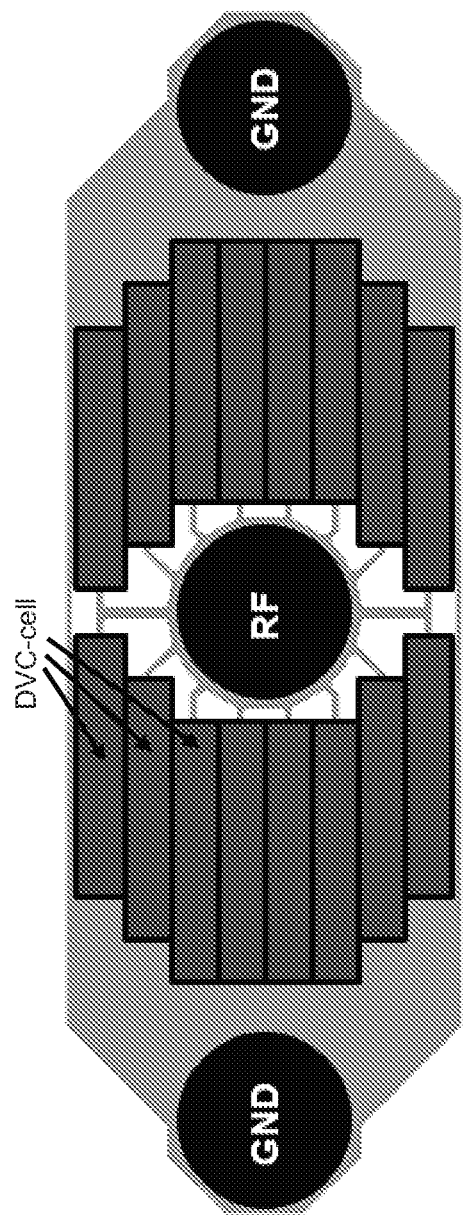
FIG. 12 is a top view of an array of DVC cells arranged to generate a multi-bit DVC array.
Figure 13:
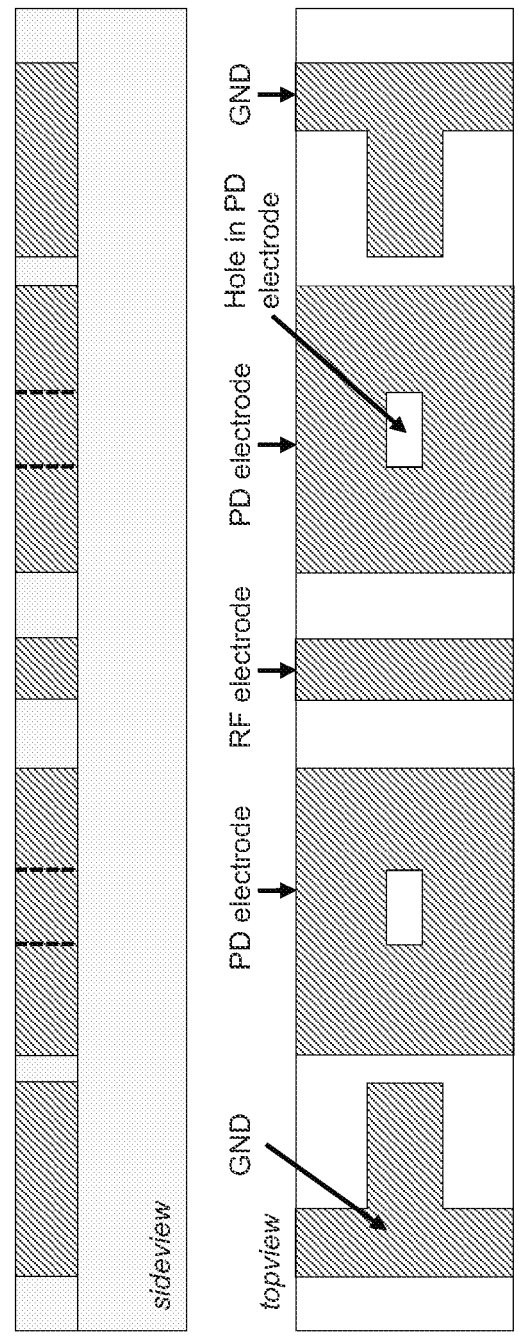
FIG. 13 is a schematic illustration of a MEMS DVC device during bottom electrode definition.

FIG. 12 shows an array of DVC-cells placed around an RF-bump. Each DVC-cell contains a number of grouped DVC-devices as shown in FIG. 11 which are all actuated at the same time. Multiple cells can be actuated at the same time, allowing for the generation of a multi-bit programmable DVC array.

Multiple ways exist to integrate the device described above into a CMOS Back-End-of-Line process. FIG. 13 through FIG. 21 show one of the possible options. First the bottom electrodes are defined (FIG. 13) which contain the PD-electrode, RF-electrode and GND connections to the DVC device. The surface is planarized by an oxide gap-fill followed by oxide CMP process. The PD-electrodes contain holes, and in some cases, surround a portion of the substrate, which will determine where the SL-contacts will appear. Suitable materials that may be used for the electrodes include electrically conductive materials commonly utilized in BEOL processes such as copper, aluminum, titanium, tantalum, tungsten, titanium nitride, and combinations thereof. The electrodes may be formed by well known deposition methods such as physical vapor deposition (PVD), chemical vapor deposition (CVD), and atomic layer deposition (ALD) and well known patterning methods such as etching and (dual) damascene process steps.

In a next step the oxide surface is recessed using a blanket recess etch. The recess guarantees that the metal electrodes will protrude above the oxide surface and ensures that the plate will land on the RF-electrode. In addition the recess etch defines the height difference between the RF-contact and the SL-contact (to be defined in the holes of the PD-electrode). The depth of the recess is typically between 10 nm and 50 nm.

Figure 15:
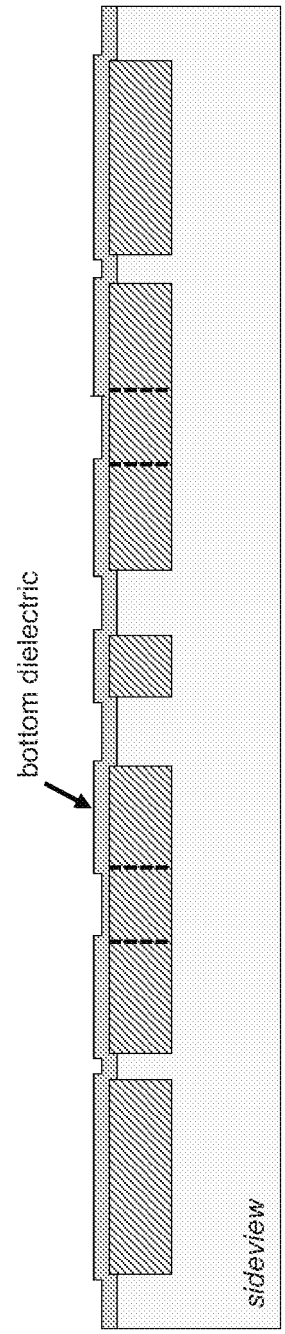
FIG. 15 is a schematic cross-sectional illustration of the MEMS DVC device after depositing the first dielectric layer.
Figure 16:
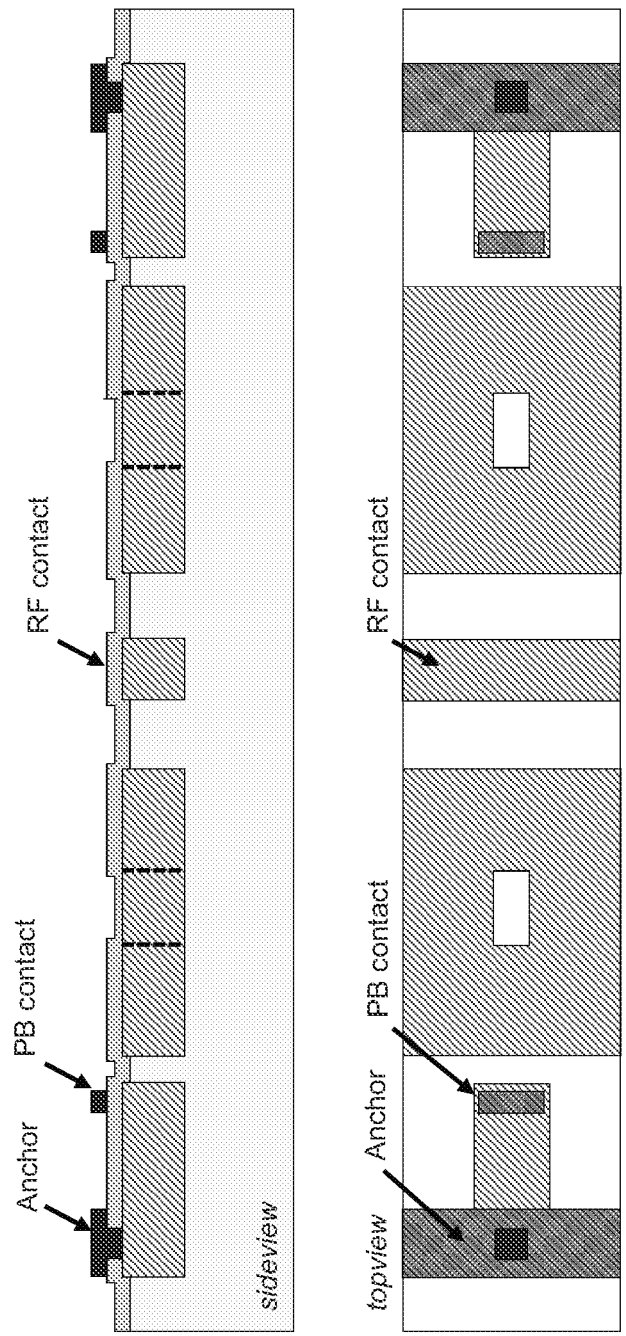
FIG. 16 is a schematic illustration of the MEMS DVC device after formation of the anchor and the plate bend contact.

In a subsequent step the surface is coated with the bottom dielectric layer (FIG. 15). The dielectric layer will determine the capacitance of the DVC in the $C_{max}$ state and can contain multiple layers. Suitable materials that may be utilized for the bottom dielectric layer include silicon nitride, silicon oxide, silicon oxynitride and alumina.

In a next step, the PB contacts and device anchor points are defined using a metal deposition and patterning step. The thickness of the metal layer defines the height difference between the PB contacts and the RF contact to provide for a high restoring force of the MEMS DVC device. Suitable materials for these electrical interconnects include electrically conductive materials commonly utilized in BEOL processes such as copper, aluminum, titanium, tantalum, tungsten, titanium nitride, and combinations thereof. The electrically conductive material may be deposited by well known deposition methods such as PVD, CVD, and ALD and the patterned by well known patterning methods such as etching.

Figure 14:
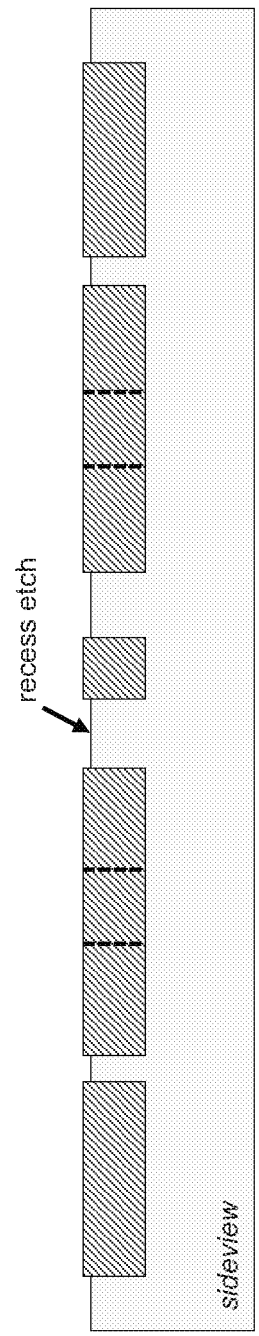
FIG. 14 is a schematic cross-sectional illustration of the MEMS DVC device after recess etching to define a height difference between the RF plateau and the secondary landing contact.
Figure 17:
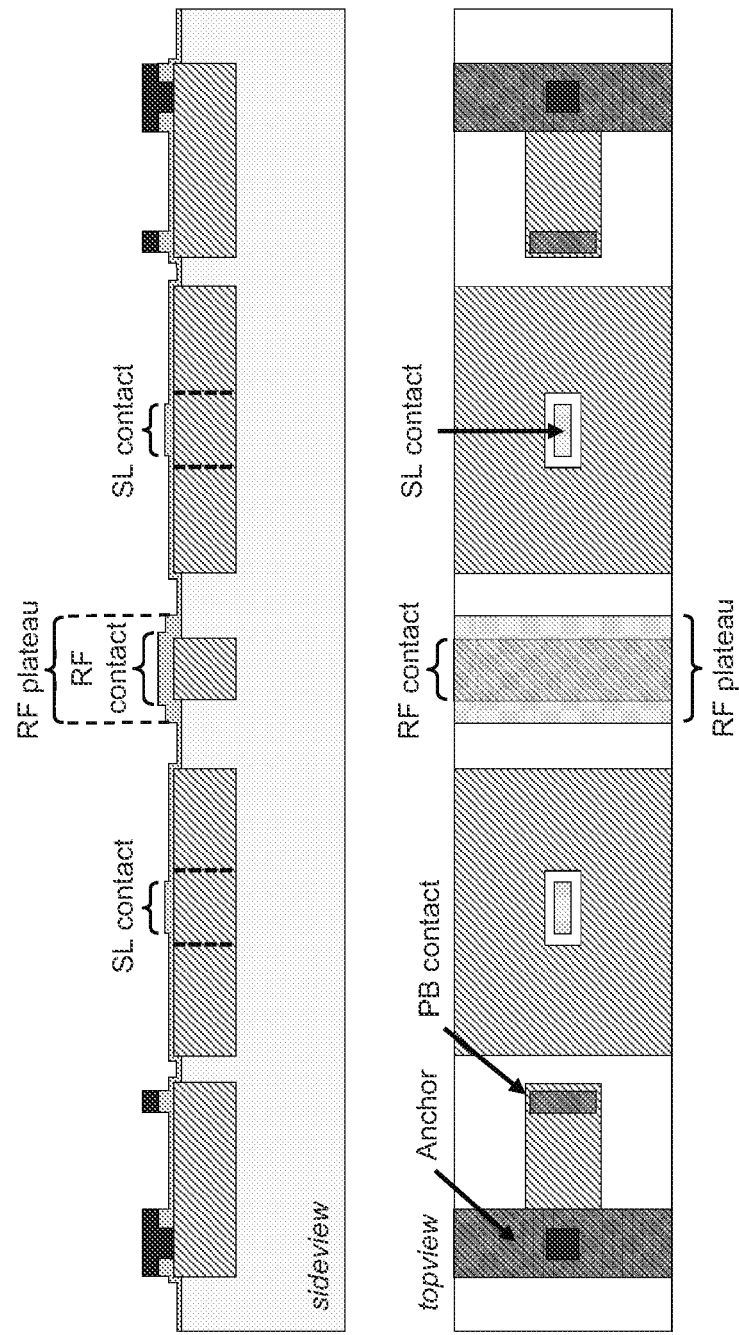
FIG. 17 is a schematic illustration of the MEMS DVC device after the formation of the secondary landing contacts and the RF plateau.

In a next step the SL contacts are defined by patterning and etching the bottom dielectric layer (FIG. 17). In addition to the SL-contacts, the RF contacts are protected during the dielectric etch which ensures that the height difference between the SL-contacts and the RF-contact that was defined during the recess etch (FIG. 14) is maintained. The RF-plateau area that is protected during this etch is typically larger than the RF-contact area itself to ensure surface planarity in a following step. The device anchor regions and PB-contacts act as hard-masks during this etch-step. The height of the PB contacts during the etch step is not changed, so that the height difference between the PB-contacts and the RF-contacts, as defined by the previous step, is maintained. The etch-step ensures that the plate in the landed $C_{max}$ state will only contact the PB, RF and SL contacts and does not touch the dielectric layer above the PD-electrode.

Figure 18:
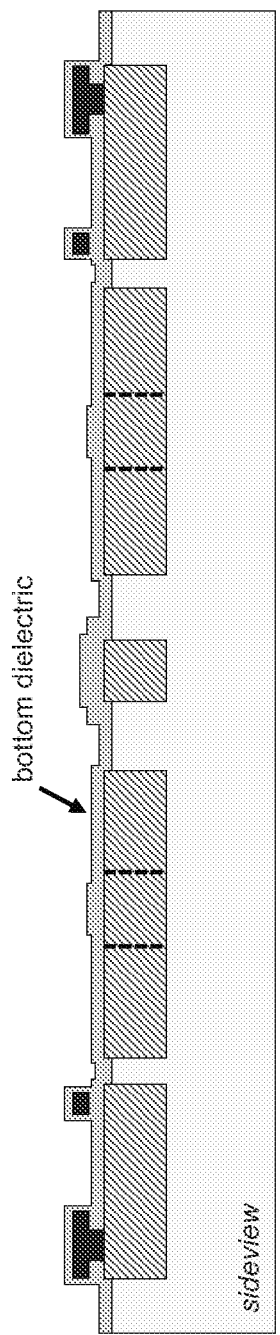
FIG. 18 is a schematic cross-sectional illustration of the MEMS DVC device after deposition of the second dielectric layer.
Figure 19:
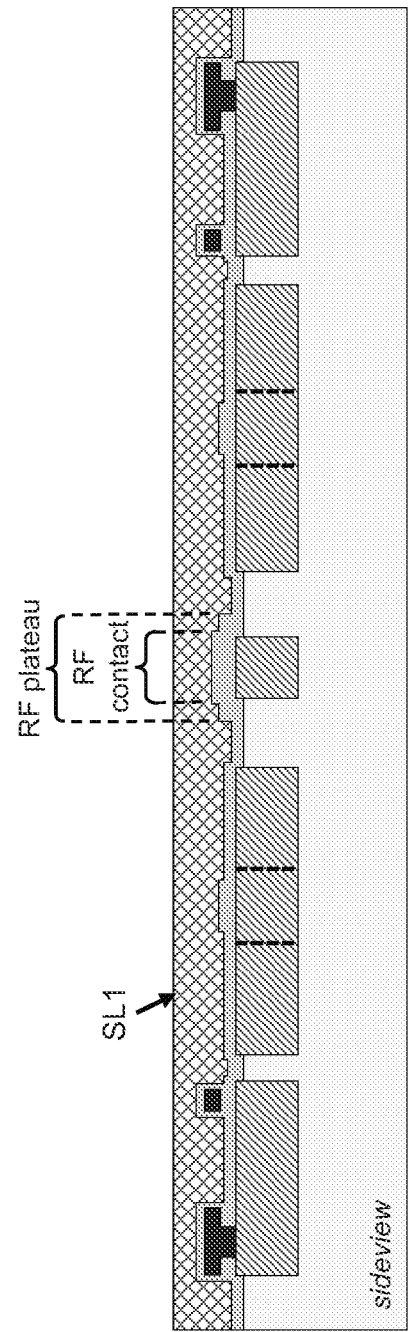
FIG. 19 is a schematic cross-sectional illustration of the MEMS DVC device after deposition of the first sacrificial layer.

Optionally, the surface can be coated with another dielectric layer if desired to protect the PB contacts (FIG. 18). Suitable materials that may be utilized for the bottom dielectric layer include silicon nitride, silicon oxide, silicon oxynitride and alumina.

The steps above describe one possible way to create the three different contact heights for the PB, RF and SL-contacts to ensure a stable landing position of the DVC in the $C_{max}$ state. In the following steps the creation of the moveable element is described. A bottom sacrificial layer is deposited on which the moveable element can be deposited in a later step. Suitable materials for the sacrificial material include spin-on glass or spin on dielectric containing a long chain molecule with a carbon backbone. Such a material would need to have a low silicon content, because the sacrificial etch to remove carbon based compounds often leave residues if they contain silicon. The sacrificial material may be deposited by well known deposition methods such as spin coating, CVD and ALD. The sacrificial material is termed a sacrificial material because the material is used to at least partially define the cavity and will be removed at a later time in the production process. Thus, the sacrificial material is used and 'sacrificed' or removed to form a cavity. The RF-plateau defined during the SL-contact formation is wider than the RF-contact region. This allows the sacrificial layer to planarize over the RF-contact region.

Figure 20:
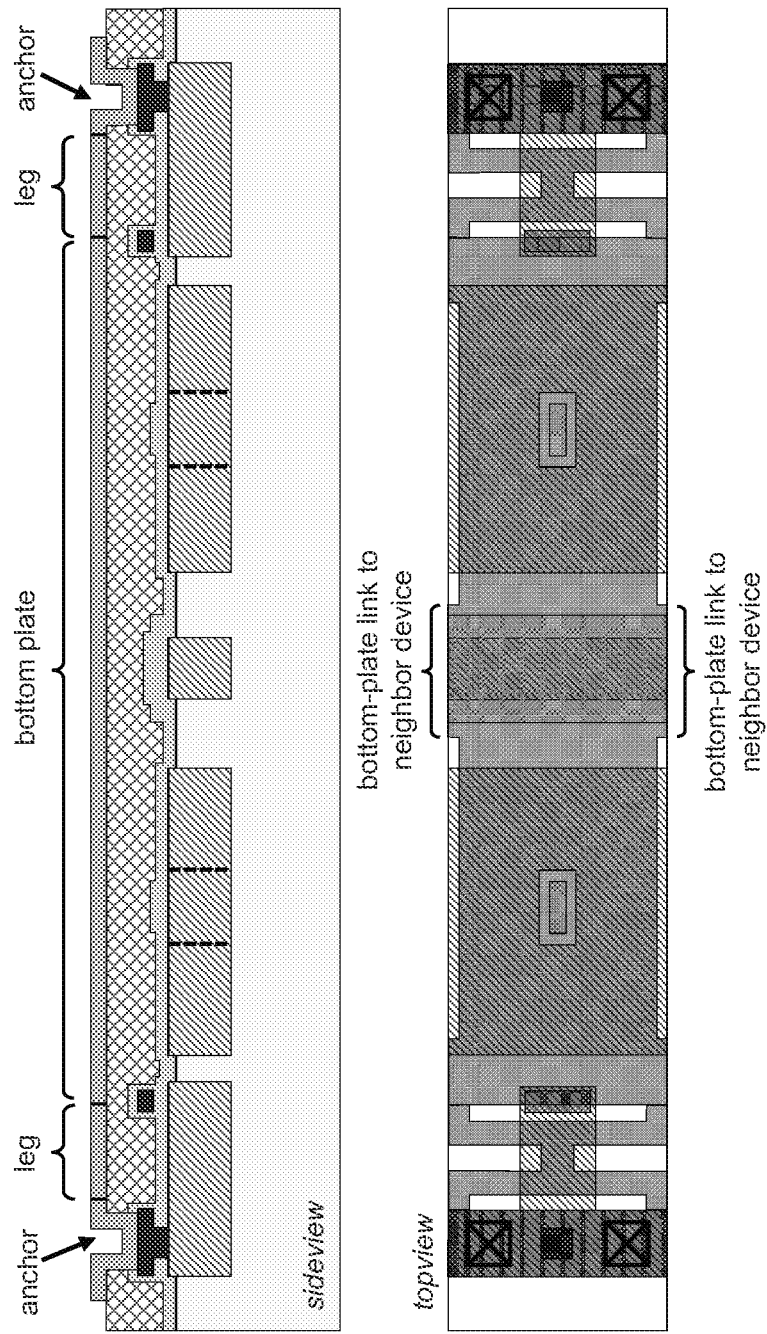
FIG. 20 is a schematic illustration of the MEMS DVC device after the formation of the bottom plate and legs.

In a next step, the first structural layer of the moveable MEMS element is generated (FIG. 20). Suitable materials that may be used for the first structural layer include titanium nitride, titanium aluminum, tungsten, copper, titanium aluminum nitride, aluminum and combinations thereof and multilayer structures such as titanium nitride-aluminum-titanium nitride. The first structural layer may be formed by depositing the material using well known deposition methods such as PVD, CVD, and ALD and then patterning the material by well known patterning methods such as etching. The material is deposited and patterned to create the bottom-plate, legs and anchors.

Figure 21:
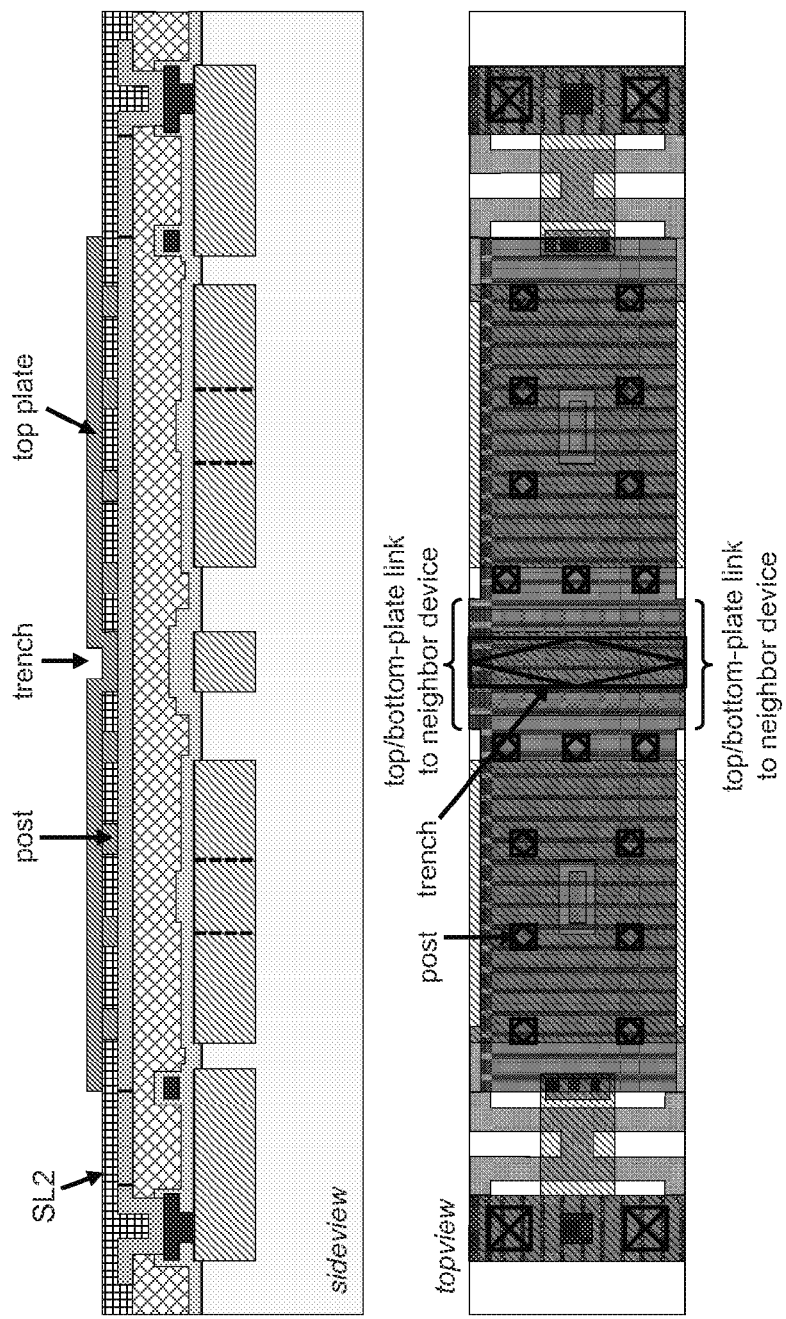
FIG. 21 is a schematic illustration of the MEMS DVC device after the formation of the top plate layer.

Subsequently, a second sacrificial layer SL2 is deposited (FIG. 21). Suitable materials for the sacrificial material include spin-on glass or spin on dielectric containing a long chain molecule with a carbon backbone. Holes and trenches are etched into the sacrificial layer SL2 and the second structural layer is deposited which is then patterned and etched to form the top-plate. In the regions where holes and trenches are etched into the sacrificial layer the top-plate is in direct contact with the bottom plate by posts. The posts can be placed close to the SL-contacts to allow for higher control voltages to be applied without risking a secondary landing on the dielectric layer. This allows the plate to be pulled more intimate with the RF-electrode resulting in a better IP3 performance.

Figure 22:
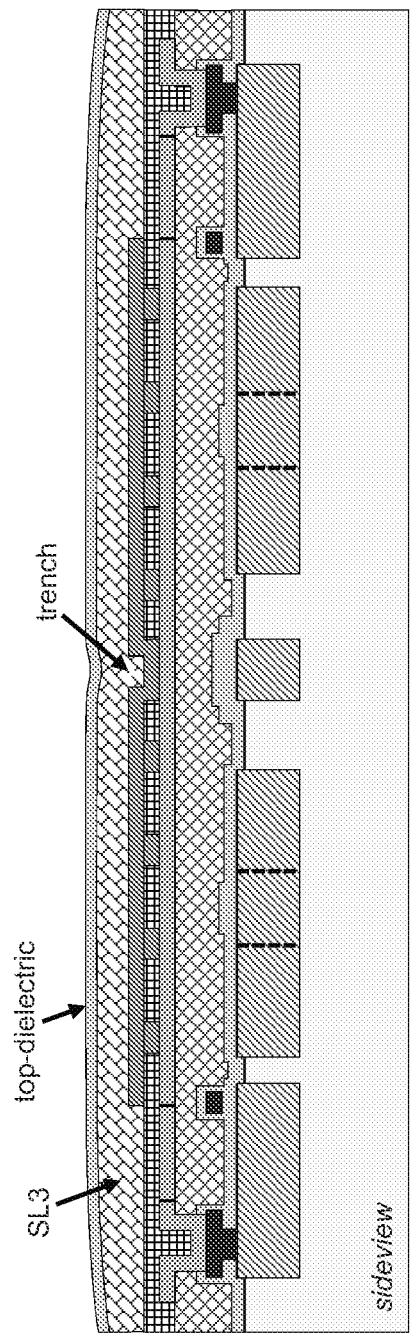
FIG. 22 is a schematic cross-sectional illustration of the MEMS DVC device after the deposition of the third sacrificial layer and the top dielectric layer.

In a next step, a third sacrificial layer SL3 and the top-dielectric layer are deposited (FIG. 22). Suitable materials for the sacrificial material include spin-on glass or spin on dielectric containing a long chain molecule with a carbon backbone. Suitable materials that may be utilized for the top dielectric layer include silicon nitride, silicon oxide, silicon oxynitride and alumina.

Although the sacrificial layer has planarizing properties, it does exhibit some dome shape over the built structure due to the planarization length of the sacrificial material. By including the trench in the top-plate, the thickness of the SL3 at the location of the trench is slightly lower. Since the actuation voltage to the top is proportional to the $1/gap^2$, the reduction in the top-dome helps to reduce the top actuation voltage. Without the trench, the sacrificial layer SL3 would exhibit a larger dome over the structure resulting in a higher top actuation voltage. The amount of SL3 dome reduction can be tuned with the width of the trench. Therefore, the trench poses a way to tune the top actuation voltage. The trench runs above the RF-electrode and also connects between neighboring DVC devices. The width of the trench can be smaller, equal to or larger than the RF electrode width. In one embodiment, rather than a trench, posts between the top-plate and the bottom-plate may be used. The use of the trench in the top-plate offsets the natural tendency for the sacrificial material to dome over the MEMS structure, thereby lowering the top actuation voltage.

Additional processing steps are performed to create the PU-electrode and the device encapsulation. At the end of the device formation, the sacrificial layers are removed in a release etch, leaving the MEMS element free to move inside the created cavity. In this way posts are created between the two plates which creates the stiff membrane. The trench over the RF-region ensures that the plate is thicker over the RF contact region to increase the local stiffness of the plate and resist plate deformation in the presence of a signal on the RF electrode. In the RF-contact region the top and bottom plate contain links to neighbouring devices to ensure that the plate lands flat on the RF-contact to further improve the device linearity.

Figure 23:
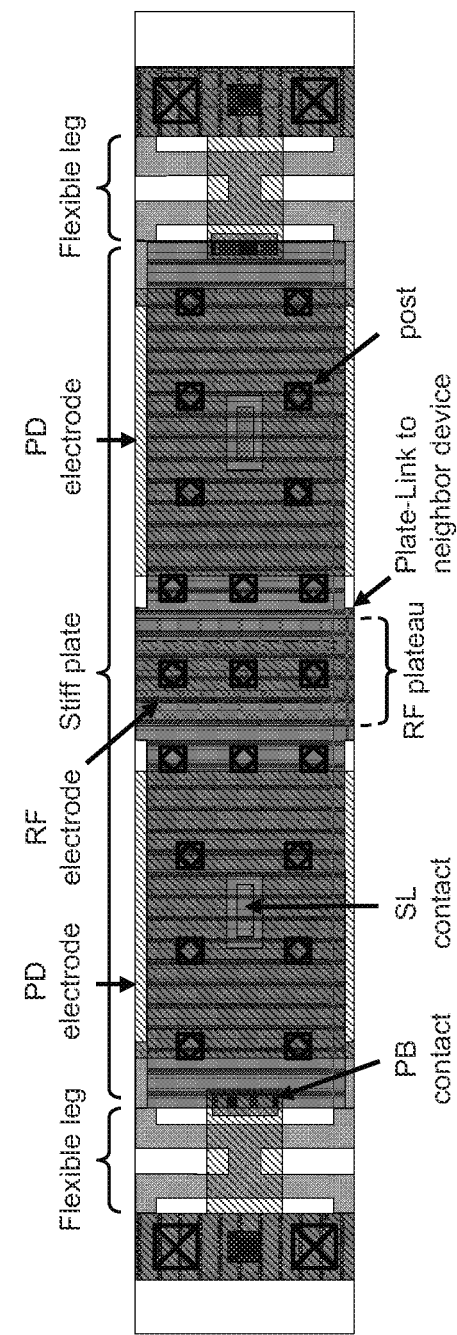
FIG. 23 is a schematic top view illustration of a MEMS DVC device with posts formed over the RF electrode.

FIG. 23 shows an alternative embodiment where the trench over the RF contact is replaced by a number of posts. In this case it would not benefit from the SL3 doming reduction as explained above.

Figure 24:
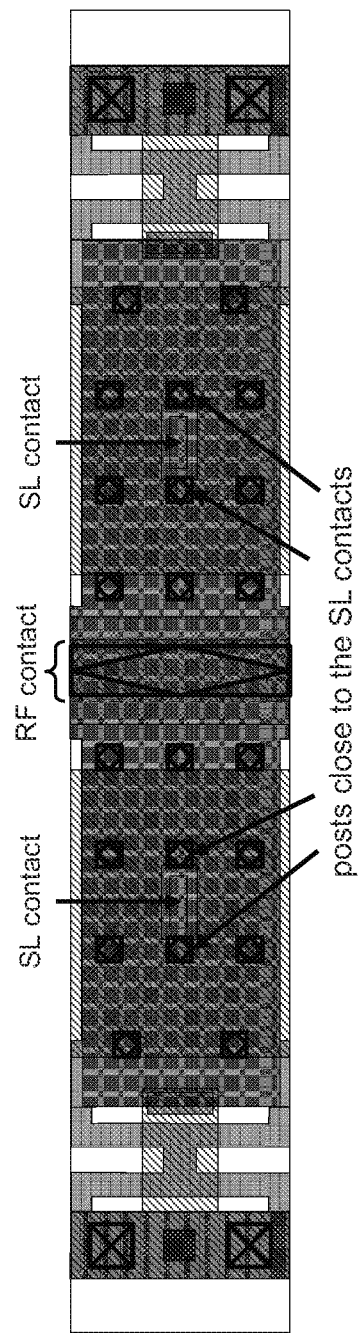
FIG. 24 is a schematic top view illustration of a MEMS DVC device with posts close to the secondary landing contacts.

Another alternative embodiment is shown in FIG. 24. The posts have been placed close to the SL-contact which further stiffens the plate when landed on the SL-contacts. When the posts are located far from the SL-contact (FIG. 4) the bottom plate can still deform when the DVC is landed in the $C_{max}$ state. By moving the posts closer to the SL-contacts the bottom-plate deformation can be reduced. This allows higher voltages to be applied to the PD-electrode which pulls the DVC device more intimate with the RF-electrode to further increase the linearity.

Figure 25:
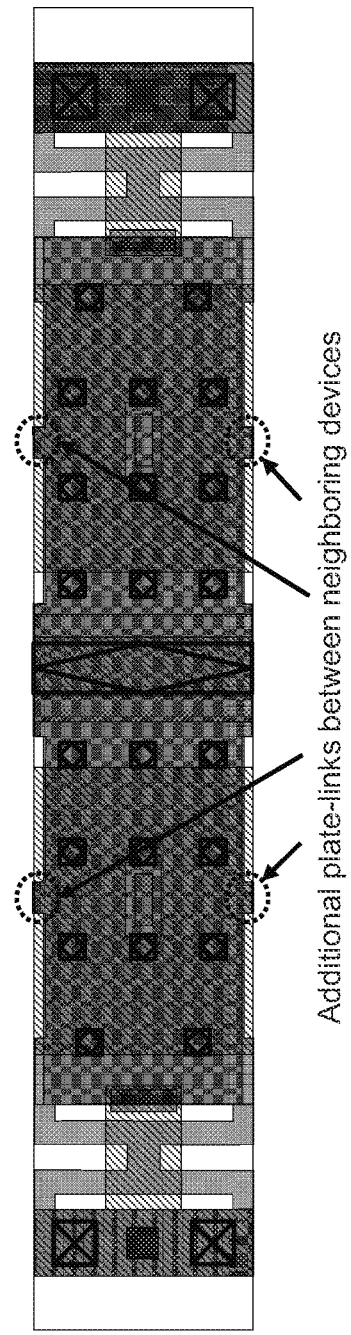
FIG. 25 is a schematic top view illustration of a MEMS DVC device having plate links near the posts to link the plate to an adjacent plate.

Another alternative embodiment is shown in FIG. 25. In this embodiment additional plate-links have also been placed between neighboring devices in the vicinity of the posts. These plate-links increase the plate stiffness in the perpendicular direction and allows for even higher voltages to be applied to the PD-electrode.

Figure 26:
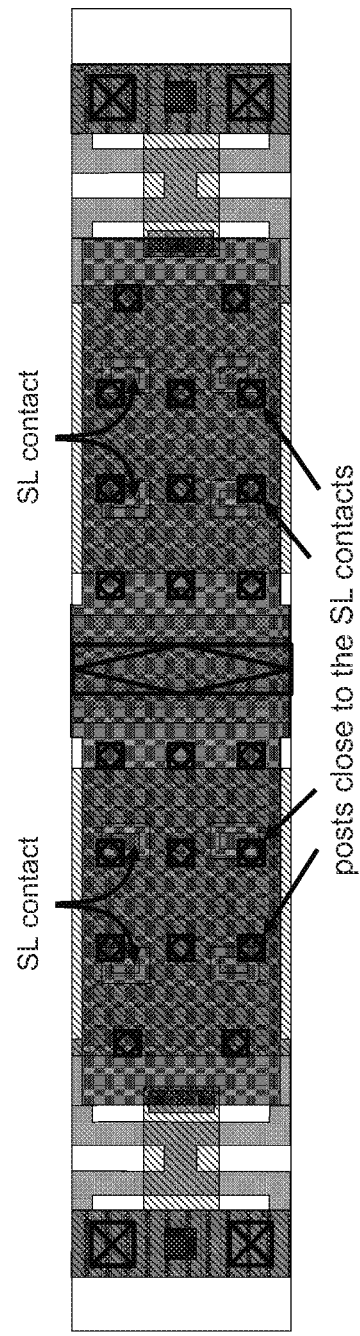
FIG. 26 is a schematic top view illustration of a MEMS DVC device according to another embodiment having multiple small secondary landing contacts.

Another alternative embodiment is shown in FIG. 26. In this embodiment several small SL contacts have been placed in the PD-electrode area. This configuration reduces the lateral distance between any landing point (RF contact, PB contact or SL contact) and further increases the stiffness of the plate which allows for even higher voltages to be applied to the PD-electrode before it results in secondary landing the plate on the PD-electrode.

Figure 27:
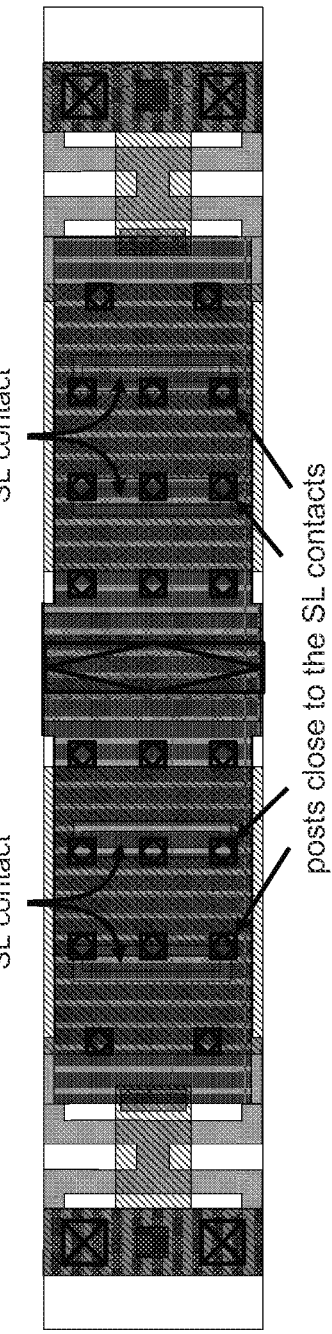
FIG. 27 is a schematic top view illustration of a MEMS DVC device according to another embodiment having multiple large secondary landing contacts.

FIG. 27 shows another embodiment in which a few large SL contacts have been distributed over the PD-electrode area. The number, size and location of the SL contacts can be varied to achieve the required robustness against secondary landing.

Figure 28:
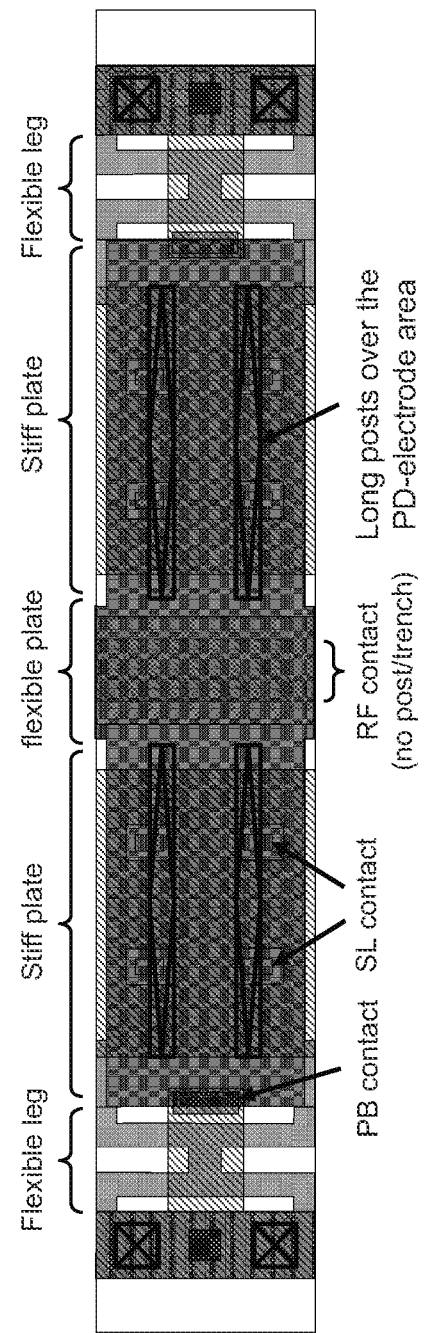
FIG. 28 is a schematic top view illustration of a MEMS DVC device according to another embodiment having long posts over the PD-electrode area and no post or trench over the RF contact-area.

Another alternative embodiment is shown in FIG. 28, which uses long posts in the plate over the PD-electrode area. The plate does not have a post or trench in the RF-contact area, which results in a flexible plate section over the RF-contact and a stiff plate section over the PD-electrode area. This effectively concentrates the contact forces on the extreme contact points upon landing (PB contact and RF contact) and provides a high contact force on the RF-contact to squash the small asperities in the contact area. A combination of long posts and small posts can be used to obtain the required plate stiffness in the longitudinal and transverse direction.

Figure 29:
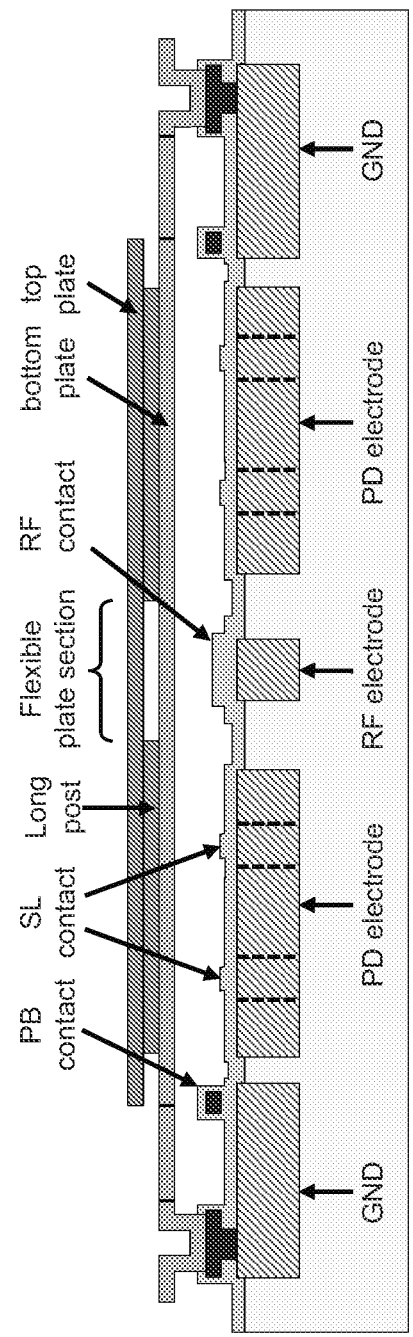
FIG. 29 is a schematic cross-sectional illustration of the MEMS DVC device of FIG. 28

FIG. 29 is a schematic cross-sectional illustration of the MEMS DVC device of FIG. 28 and shows the flexible plate section over the RF contact area.

Figure 30:
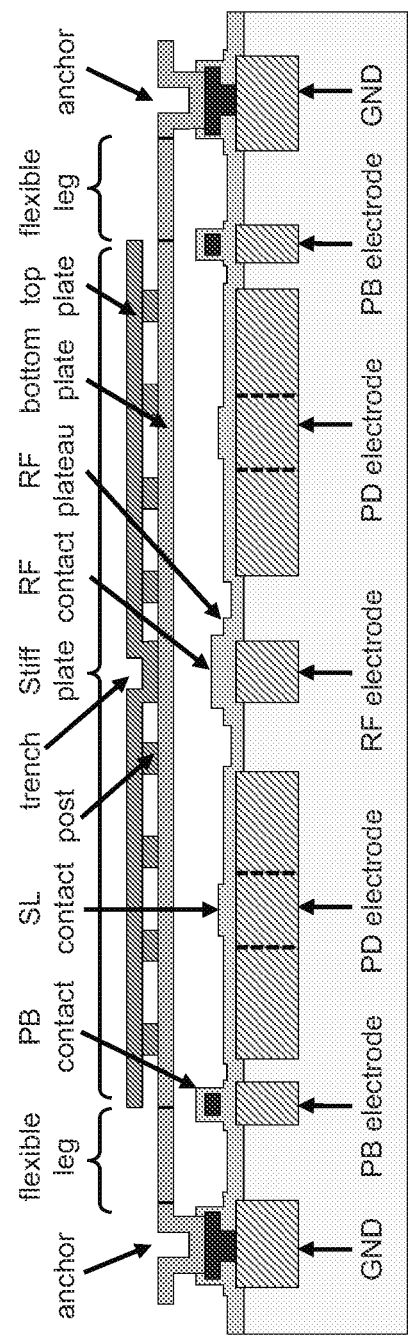
FIG. 30 is a schematic cross-sectional illustration of a MEMS DVC device according to another embodiment.

FIG. 30 is a schematic cross-sectional illustration of a MEMS DVC device according to another embodiment. In the embodiment shown in FIG. 30, the PB contacts are not disposed above the ground electrodes to which the anchor is coupled, but rather, are coupled to an entirely new electrode. PB electrodes may be disposed within the substrate with the PB contacts disposed thereabove. The PB contacts are electrically isolated from the PB electrodes and thus are electrically floating. In one embodiment, the PB electrodes may be coupled to ground. The PB electrodes exemplify an alternative embodiment to the MEMS DVC device shown in FIG. 4 so that the skilled artisan will appreciate that the PB contacts need not be disposed above the ground electrodes. Rather, the PB contacts may be disposed above a different electrode or simply above the substrate. Regardless of the location of the PB contacts, the PB contacts are disposed at a location such that the PB contacts extend above the substrate for a height that is greater than the height of the secondary landings and the RF contacts.

The MEMS DVC device discussed herein utilized three different landing points of different height. By having different heights, the movable plate of the MEMS DVC can wrap around the RF line. The PB contacts, which are higher than the RF contact, are defined at the ends of the rigid plate to provide for a high restoring force (the stiff plate has to bend) which can pull the plate off the RF even if an RF signal is present.

The MEMS DVC device does not touch the bottom dielectric layer above the pull-in electrode to avoid charging of the dielectric layer due to the presence of the secondary landing contacts. The secondary landing contacts protrude above the dielectric layer above the PD-electrode. The secondary landing contacts themselves do not have the PD-electrode defined underneath so that on landing the electric field in the secondary landing contacts is small enough to avoid charging. The secondary landing contacts extend above the substrate to a distance that is less than the distance that the RF plateau extends above the substrate to ensure the plate lands intimately on the RF-contact.

While the foregoing is directed to embodiments of the present invention, other and further embodiments of the invention may be devised without departing from the basic scope thereof, and the scope thereof is determined by the claims that follow.

The invention claimed is:

1. A MEMS DVC, comprising:
   a substrate having at least one first electrode, at least one second electrode and an RF electrode disposed therein;
   a dielectric layer disposed over the substrate, the at least one first electrode, the at least one second electrode and the RF electrode, wherein the dielectric layer comprises an RF plateau over the RF electrode and at least one secondary landing contact above the at least one second electrode; and
   a plate coupled to the at least one first electrode and extending over the at least one second electrode and the RF electrode, the plate movable from a first position spaced from the dielectric layer and a position in contact with the RF plateau, wherein the at least one second electrode surrounds a portion of the substrate and wherein the secondary landing contact is disposed over the portion of the substrate surrounded by the at least one second electrode.

2. The MEMS DVC of claim 1, wherein the one or more secondary landing contact has a height that is less than the height of the RF plateau.

3. The MEMS DVC of claim 2, wherein the one or more secondary landing contacts are between about 10 nm to about 50 nm smaller than the RF plateau.

4. The MEMS DVC of claim 1, further comprising one or more plate bend contacts disposed over the at least one first electrode, wherein the one or more plate bend contacts are enclosed within the dielectric layer.

5. The MEMS DVC of claim 4, wherein the one or more plate bend contacts have a height that is greater than the height of the RF plateau.

6. The MEMS DVC of claim 5, wherein the one or more plate bend contacts are between about 30 nm to about 80 nm taller than the RF plateau.

7. A MEMS DVC, comprising:
- a substrate having at least one first electrode, at least one second electrode and an RF electrode disposed therein;
- a dielectric layer disposed over the substrate, the at least one first electrode, the at least one second electrode and the RF electrode, wherein the dielectric layer comprises an RF plateau over the RF electrode and at least one secondary landing contact above the at least one second electrode;
- a plate coupled to the at least one first electrode and extending over the at least one second electrode and the RF electrode, the plate movable from a first position spaced from the dielectric layer and a position in contact with the RF plateau; and
- one or more plate bend contacts disposed over the at least one first electrode, wherein the one or more plate bend contacts are enclosed within the dielectric layer, and wherein the one or more plate bend contacts are disposed between the RF plateau and the at least one first electrode.

8. The MEMS DVC of claim 7, wherein the one or more plate bend contacts have a height that is greater than the height of the RF plateau.

9. A MEMS DVC, comprising:
- a substrate having at least one first electrode, at least one second electrode and an RF electrode disposed therein;
- a dielectric layer disposed over the substrate, the at least one first electrode, the at least one second electrode and the RF electrode, wherein the dielectric layer comprises an RF plateau over the RF electrode and at least one secondary landing contact above the at least one second electrode;
- a plate coupled to the at least one first electrode and extending over the at least one second electrode and the RF electrode, the plate movable from a first position spaced from the dielectric layer and a position in contact with the RF plateau; and
- one or more plate bend contacts disposed over the at least one first electrode, wherein the one or more plate bend contacts are enclosed within the dielectric layer, wherein the one or more plate bend contacts have a height that is greater than the height of the RF plateau, and wherein the one or more plate bend contacts are between about 30 nm to about 80 nm taller than the RF plateau.

10. A MEMS DVC, comprising:
- a substrate having at least one first electrode, at least one second electrode and an RF electrode disposed therein;
- a dielectric layer disposed over the substrate, the at least one first electrode, the at least one second electrode and the RF electrode, wherein the dielectric layer comprises an RF plateau over the RF electrode and at least one secondary landing contact above the at least one second electrode; and
- a plate coupled to the at least one first electrode and extending over the at least one second electrode and the RF electrode, the plate movable from a first position spaced from the dielectric layer and a position in contact with the RF plateau, wherein the at least one first electrode comprises two electrodes, wherein the at least one second electrode comprises two electrodes, wherein the plate is coupled to both electrodes of the at least one first electrode, and wherein the two electrodes of the at least one second electrode each surround a portion of the substrate.

11. The MEMS DVC of claim 10, wherein a secondary landing contact is disposed over the substrate at each portion surrounded by an electrode of the at least one second electrode.

12. A method for manufacturing a MEMS DVC, comprising:
- forming a plurality of electrodes into a substrate;
- etching the substrate such that the plurality of electrodes extend above the substrate;
- depositing a first dielectric layer over the substrate and the plurality of electrodes;
- depositing and patterning an electrically conductive material over the first dielectric layer;
- patterning and partially etching the first dielectric layer to create a secondary landing contact over a first electrode of the plurality of electrodes and an RF plateau over an RF electrode of the plurality of electrodes, and to expose a portion of the electrically conductive material;
- depositing a second dielectric layer over the exposed electrically conductive material, the RF plateau and the secondary landing contact; and
- forming a plate over the second dielectric layer, the plate electrically connected to a second electrode of the plurality of electrodes, wherein the plate is movable from a position spaced from the RF plateau and a position in contact with the RF plateau, wherein the RF plateau extends a greater distance above the substrate as compared to the secondary landing contact.

13. The method of claim 12, further comprising etching the first dielectric layer to expose the second electrode.

14. The method of claim 13, wherein depositing and patterning an electrically conductive material comprises depositing the electrically conductive material over the exposed second electrode and the remaining first dielectric layer, and removing selective portions of the electrically conductive layer such that a first portion remains in electrical contact with the second electrode and a second portion remains over the first dielectric layer.

15. The method of claim 14, further comprising selectively partially etching the remaining first dielectric layer such that a thicker portion of the first dielectric material remains over the RF electrode as compared to a portion disposed over the first electrode.

16. The method of claim 15, wherein the first electrode surrounds a portion of the substrate and wherein the secondary landing contact is disposed over the portion of the substrate surrounded by the first electrode.

17. The method of claim 12, wherein depositing the second dielectric layer comprises depositing the second dielectric layer over the second portion of the electrically conductive material to create a plate bend contact that extends above the substrate a greater distance than the RF plateau extends above the substrate.

18. The method of claim 17, wherein the plate bend contact is disposed over the second electrode.

19. The method of claim 18, wherein selectively etching the remaining first dielectric layer results in a portion of the first dielectric layer remaining over the portion of the substrate surrounded by the first electrode and wherein the portion of the first dielectric layer remaining over the portion of the substrate surrounded by the first electrode extends above the substrate for a distance that is less than a distance that the RF plateau extends above the substrate and greater than a distance any remaining first dielectric layer extends above the substrate.

20. The method of claim 17, wherein the plate bend contact is disposed over a third electrode.

21. The method of claim 20, wherein the plate is movable from the position spaced from the RF plateau to a position in contact with both the RF plateau and the secondary landing contact.

22. The method of claim 21, wherein the first electrode surrounds a portion of the substrate and wherein the secondary landing contact is disposed over the portion of the substrate surrounded by the first electrode.

* * * * *